(12) United States Patent
Degardin et al.

(10) Patent No.: US 6,380,777 B1
(45) Date of Patent: Apr. 30, 2002

(54) OUTPUT DRIVER HAVING CONTROLLED SLEW RATE

(75) Inventors: Christophe Degardin; Philippe Girard, both of Corbeil-Essonnes; Guillaume Vercasson, Chabeuil, all of (FR)

(73) Assignee: International Business Machinesc Corporation, Armonk, NY (US)

( * ) Notice: Subject to any disclaimer, the term of this patent is extended or adjusted under 35 U.S.C. 154(b) by 0 days.

(21) Appl. No.: 09/641,412

(22) Filed: Aug. 18, 2000

(30) Foreign Application Priority Data

Aug. 20, 1999 (EP) .......................................... 99480080

(51) Int. Cl.$^7$ ................................................ H03K 5/12
(52) U.S. Cl. .......................... 327/170; 327/65; 330/295
(58) Field of Search .............................. 327/63, 65, 66, 327/77, 89, 350, 170, 560–563; 330/310, 295, 252, 253

(56) References Cited

U.S. PATENT DOCUMENTS

| | | | | |
|---|---|---|---|---|
| 5,517,134 A | * | 5/1996 | Yaklin | 327/65 |
| 5,677,646 A | * | 10/1997 | Entrikin | 330/295 |
| 5,886,577 A | * | 3/1999 | Keating | 330/295 |

* cited by examiner

Primary Examiner—Toan Tran

(57) ABSTRACT

An off chip driver circuit is adapted to output differential output signals at high speed rate and capable to drive high external loads without degradation of the output signals. Specifically the driver comprises a first differential pair of transistors having first differential input terminals to respectively receive differential input signals and having first differential output terminals to output the differential output signals. A first current source circuit is connected to a first common terminal of each transistor of the first differential pair of transistors. The current source is sized to provide a first current flow upon receiving the differential input signals. The driver further comprises at least a second differential pair of transistors having second differential output terminals connected in parallel to the first differential output terminals. The second differential pair of transistors respectively receives delayed differential input signals of the differential input signals on respective second differential input terminals. At least a second current source circuit is connected to a second common terminal of each transistor of the second differential pair of transistors. The second current source is sized to provide a second current flow upon receiving the delayed differential input signals. The output driver is designed such that the delay between the first and the at least second differential input signals and the value of the first and the at least second current flows are adjusted to control the slew rate of the differential output signals.

3 Claims, 7 Drawing Sheets

US 6,380,777 B1

OUTPUT DRIVER HAVING CONTROLLED SLEW RATE

TECHNICAL FIELD

The present invention relates to off-chip driver (OCD), and more particularly to an ECL OCD to control the slew rate and waveforms of an output signal.

BACKGROUND ART

In high speed data transmission, integrated circuits designed at the boundary of a chip may deliver a large amount of currents to various external loads. Generally, bipolar open drain output drivers are designed to achieve the high data rate. However, the switching of output signals within the bipolar voltage swing induces current peaks which flow through the cables of packages and boards (PCB). These noisy conditions degrade the global performance of the circuits which must wait a steady state to operate.

In the context of hard disk drives, such currents which may be over 10 mAmpere (mA) should be delivered at a frequency over 100 MHz to the output loads. These latter generally show a characteristic impedance in terms of inductance which may be in the range of 10 to 20 nHenry (nH). Conventional output drivers while being satisfactory when operating at a frequency of 100 MHz for driving low external inductance (under 10 nH) are limited in higher ranges of both the frequency and the load inductance.

FIG. 1-a illustrates a conventional open drain output driver 100 having a differential pair of open drain transistors (102,104). The transistors may be designed as FET devices (N-FET or P-FET having gate, source and drain terminals) or as bipolar devices (having base, emitter and collector terminals) or as mixed technology devices. A first resistor 106 is connected between the high voltage power source terminal and the drain of the first transistor 102. Similarly, a second resistor 108 is also connected between the high voltage power source terminal and the drain of the second transistor 104. The value of the resistors is generally in the 50 ohms range to ensure the low level output voltage of the driver.

The source of each transistor is common and connected to a conventional current source 110 of the type current mirror such as the well-known Wildar or Wilson or cascaded structure. The intrinsic impedances of the output loads are represented on FIG. 1 by inductive devices (112,114) extending from the output chip terminals (116,118) on the chip boundary (represented by the doted line) and the external resistors (106,108). In operation, the input of one transistor (the gate for FET type transistor) receives a positive signal 'IP' from a previous connected circuitry, while the input of the other transistor receives a complementary negative signal 'IN'. The signals may be either clock signals or control ones or data signals. Differential output signals 'OP/ON' are generated on appropriate output. quality of the output signals 'OP' and 'ON' is directly dependent on both the frequency rate and the value of the intrinsic inductances as is shown on FIGS. 1-b and 1-c.

FIG. 1-b is a waveform representation of the input signals 'IP' and 'IN' and the responsive output signals 'OP' and 'ON' when the Off-Chip Driver operates at a frequency of 100 MHz and for a load inductance in the order of 6 nH.

FIG. 1-c is a waveform representation of the input signals 'IP' and 'IN' and the responsive output signals 'OP' and 'ON' when the conventional Off-Chip Driver operates at a frequency of 400 MHz and for a load inductance in the order of 15 nH. It is clear from these curves that increasing the data rate and the output load directly impacts the output waveforms and generates transient conditions that prevent from such high speed use with conventional off chip drivers.

A prior art solution to control the output waveforms is proposed in U.S. Pat. No. 5,682,116 from Dreibelbis and al. An OCD has sequential circuitry to control the slew rate (dI/dt) of the current leaving the chip. Three output drivers are provided which turn on sequentially. An enable signal activates or deactivates the entire third driver to allow that only the two first drivers will be operating. With this solution, the slew rate is adjusted to fit the load inductance. However, such solution only applies to full swing CMOS transistors operating between ground level and positive power supply level. Moreover, only single ended output drivers are concerned and as such this solution is not adapted for differential ECL like drivers.

It is to be noted that the above described problems, and others, are solved through the subject invention, and will become more apparent, to one skilled in the art, from the detailed description of the subject invention.

Accordingly, it would be desirable to be able to provide an off chip driver that operates at high speed data rate on high output loads without causing degradation of the output waveforms.

SUMMARY OF THE INVENTION

It is an object of this invention to provide an off chip driver having slew rate control and output waveforms signals control. This object is achieved by employing an off chip driver consisting of several differential pairs of open drain transistors connected in parallel to weighted current sources and receiving delayed input signals.

According to the invention, there is provided an off chip driver circuit adapted to output differential output signals at high speed rate and capable to drive high external loads without degradation of the output signals. Specifically the driver comprises a first differential pair of transistors having first differential input terminals to respectively receive differential input signals and having first differential output terminals to output differential output signals. A first current source circuit is connected to a first common terminal of each transistor of the first differential pair of transistors. The current source is designed to provide a first current flow upon receiving the differential input signals. The driver further comprises at least a second differential pair of transistors having second differential output terminals connected in parallel to the first differential output terminals. The second differential pair of transistors respectively receives delayed differential input signals of the differential input signals on respective second differential input terminals. A second current source circuit is connected to a second common terminal of each transistor of the second differential pair of transistors. The second current source is designed to provide a second current flow upon receiving the delayed differential input signals. The output driver is designed such that the delay between the first and the at least second differential input signals and the value of the first and the at least second current flows are adjusted to control the slew rate of the differential output signals.

BRIEF DESCRIPTION OF THE DRAWINGS

FIG. 1-b and 1-c illustrates the output signals of the circuit of FIG. 1-a under different operating conditions.

DETAILED DESCRIPTION OF THE INVENTION

Figure 2:
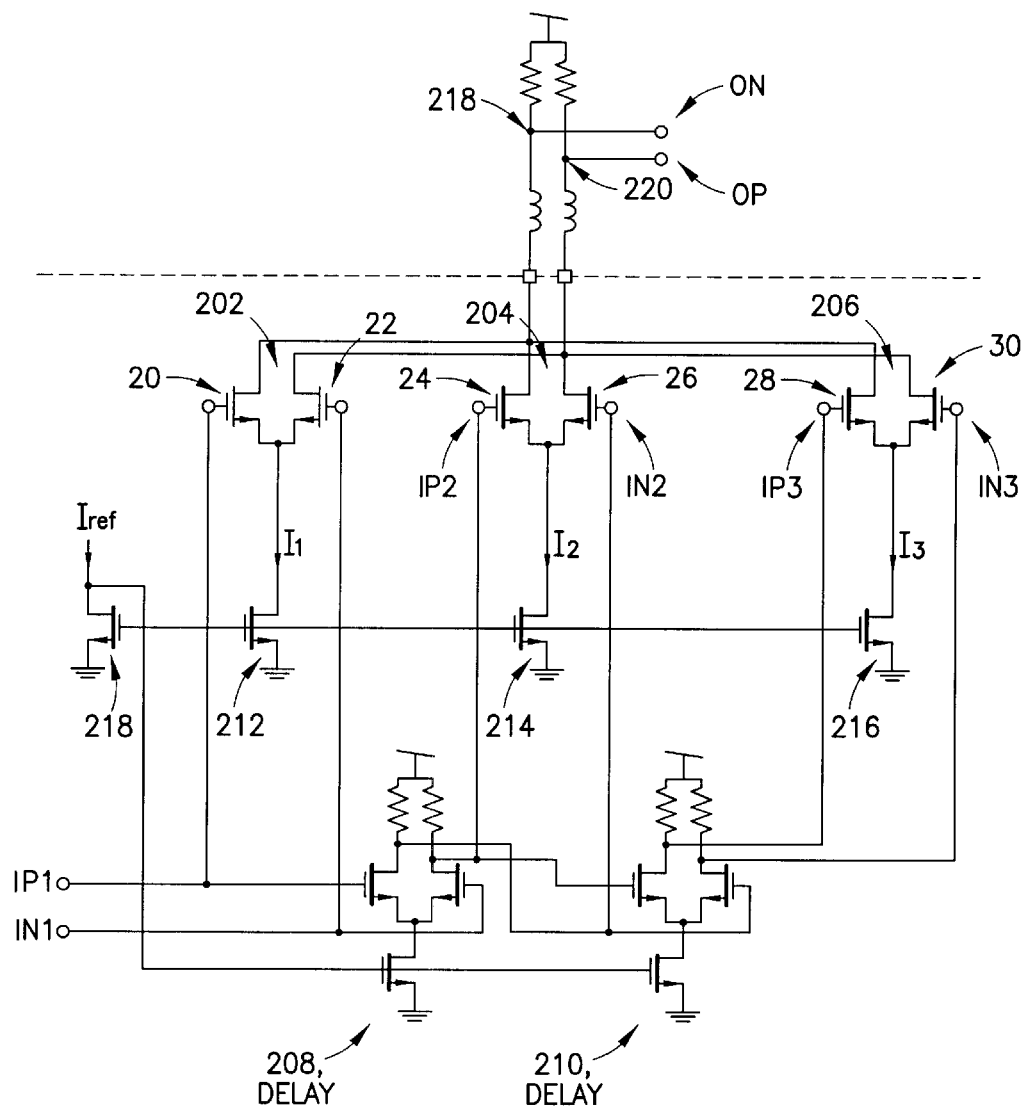
FIG. 2 is a schematic diagram of the preferred embodiment of the present invention.

Referring now to the drawings, and more particularly to FIG. 2, there is shown the off chip driver according to the invention. The driver 200 consists of three differential pairs of open drain drivers (202,204,206), connected in parallel. It is noted that the number of differential pairs of open drain drivers is not limited to three as illustrated in the preferred embodiment, but any various numbers can be used to generate the appropriate waveform of the output signal as will be described later with reference to FIGS. 5 and 6.

Each differential pair (202,204,206) is composed of a first FET transistor (20,24,28) receiving respectively a first, a second and a third input signal (IP1,IP2,IP3) on respective gate and a second FET transistor (22,26,30) receiving respectively a first, a second and a third complementary input signal (IN1,IN2,IN3) on respective gate. The second input signal IP2 is delayed by a predetermined time interval from the first input signal while the third input signal is also delayed by a predetermined time interval from the second input signal. Similarly the complementary input signals IN2 and IN3 are also delayed by predetermined time intervals. The delay circuit may be any conventional delay line comprising inverters chain or like the one illustrated on FIG. 2 with references (208,210).

The source of the FETs of each differential pair is common and connected to a current source, respectively numbered 212, 214 and 216. The current source is preferably composed of a conventional current source of the type current mirror, having a reference FET transistor 218 for providing a reference current Iref. Each current source is composed of a FET transistor (212,214,216) having its gate connected to the gate of the reference transistor 218 and its drain connected to the common sources of the corresponding differential pair.

The drain of each first FET transistor (20,24,28) is common and connected to one end of a first resistor load 218. Similarly, the drain of each second FET transistor (22,26,30) is common and connected to one end of a second resistor load 220. The other end of each resistor is connected to a positive voltage. The outputs of the off chip driver are referenced as 'ON' for the output generated by the first input signals (IP1,IP2,IP3) and as 'OP' for the output generated by the complementary input signals (IN1,IN2,IN3).

Each differential pair of transistors and the associated current source are designed to ensure that the gates width (W1,W2,W3) of the transistors of each differential pair (202,204,206) and the currents (I1,I2,I3) flowing in each current source are linearly related to make them proportional according to the following equation:

$$W1/T1 = W2/T2 = W3/T3$$

whereby the total current flowing in either the output line 218 or 220 is equal to the sum of the currents flowing in each current source.

In operation, when complementary switching 'IP1/IN1' are applied to the respective gates of transistors (20,22) of first differential pair, one of the transistor 20 or 22 becomes active, the other turns off. A first current I1 flows through the respective output line 218 or 220. The amount of current is determined by the sizing of the transistor of the first current source. After the first time interval, complementary switching signals 'IP2/IN2' are applied to the gates of transistors 24 and 26 of second differential pair. Similarly, one of the transistor 24 or 26 turns on and the other turns off. A second current I2 is then pulled in the corresponding output line 218 or 220. Finally, after the second time interval, complementary switching signals 'IP3/IN3' are applied to the gates of transistors 28 and 30 of third differential pair. A third current I3 is then pulled in the output line 218 or 220 corresponding to the active transistor.

It is a major advantage of the invention that the amplitude of each current pulse as well as its duration be adjusted individually by an appropriate design of each current source combined with a predefined time interval between the switching signals.

Figure 3:
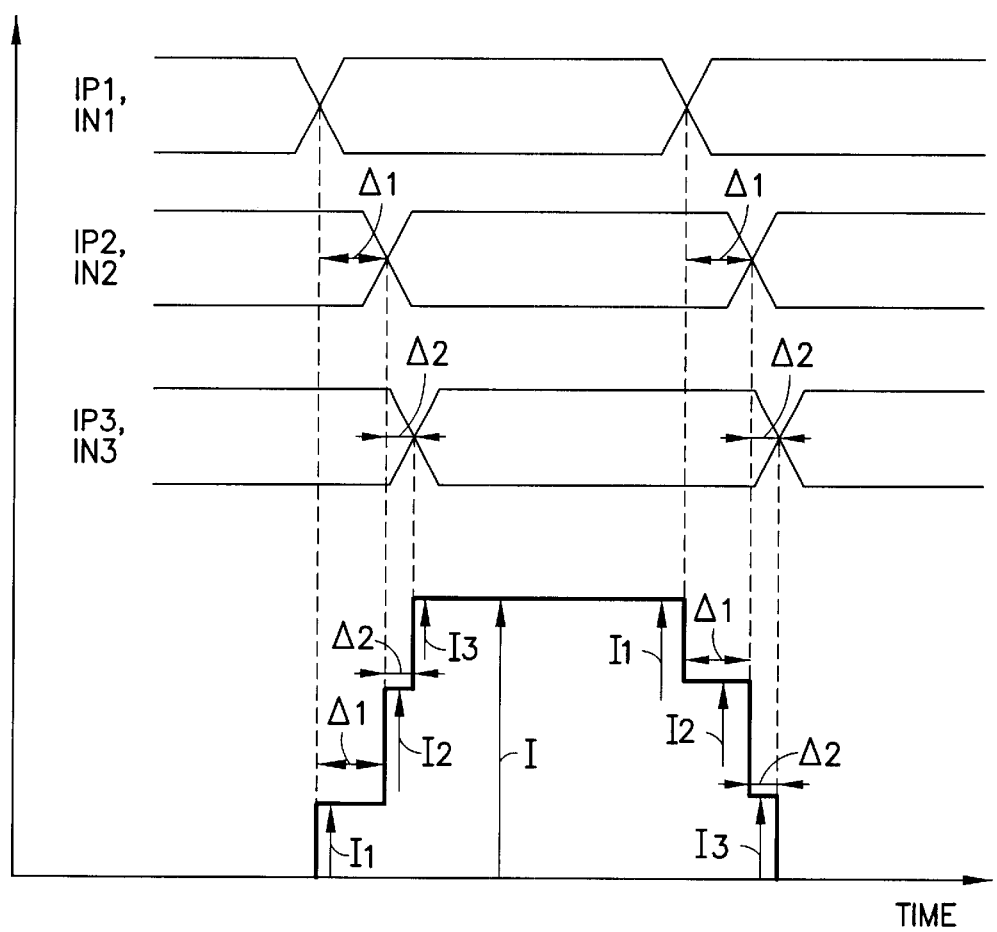
FIG. 3 illustrates theoretical output signals of the preferred embodiment of the circuit of the present invention.

The curve of FIG. 3 illustrates theoretically the current waveform obtained by a three stages circuit of the invention. On top of FIG. 3, three complementary pairs of input signals 'IP1/IN2,IP2/IN2,IP3/IN3' are delayed with respective time intervals. For sake of clarity the three curves are separated which is not to be interpreted as a variation in the voltage value. The bottom curve shows the current waveform flowing in the output line of the off chip driver circuit. In the present example, the three current sources are identical and the delays between the input signals have been set to the same value, in order to generate the discretized curve as illustrated. It is clear that the skilled person will easily devise any other current waveform in term of width and height of the current pulses by changing the sizing of the transistors of the current sources (212,214,216) and by adjusting the delays between the input signals.

Figure 1A:
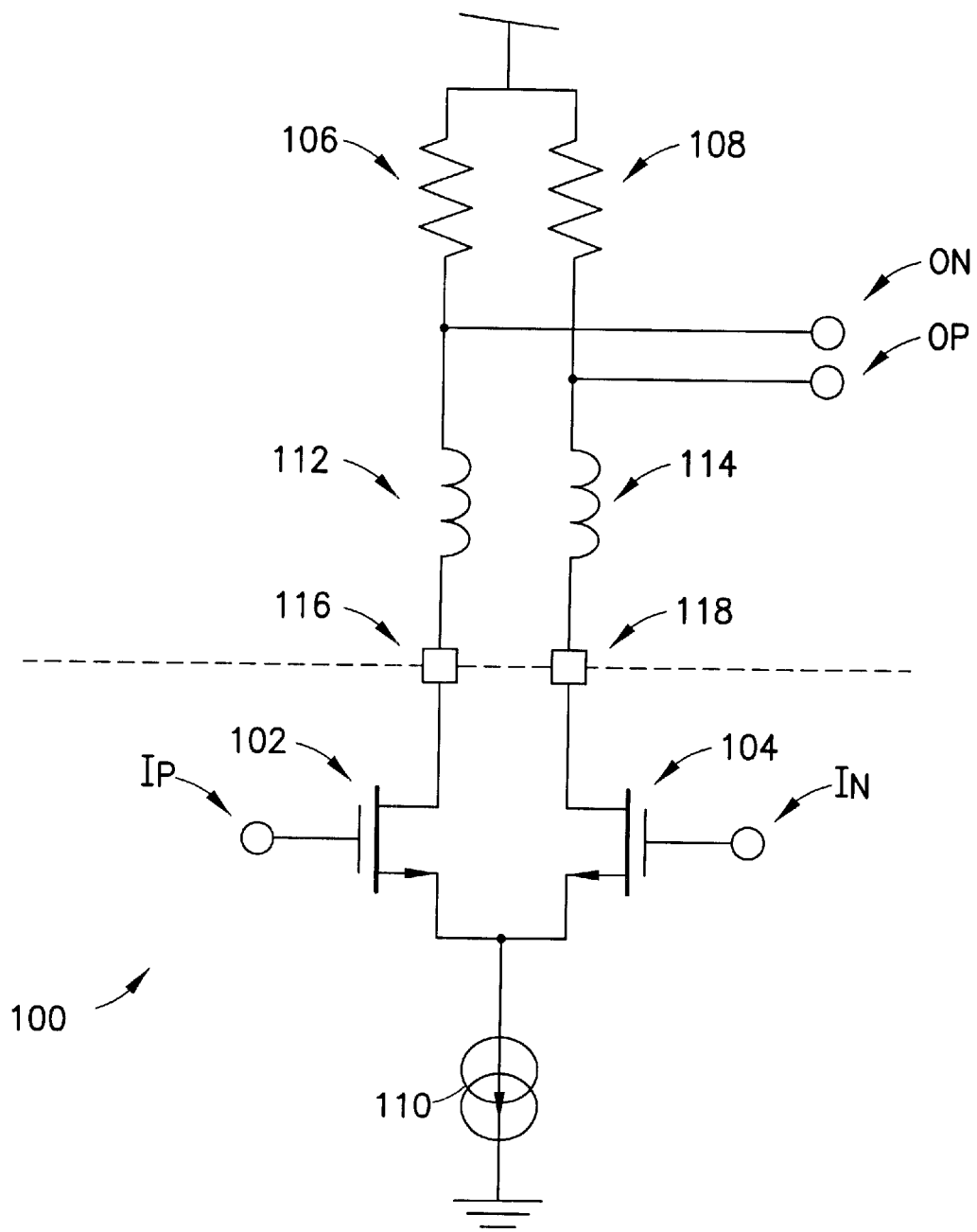
FIG. 1-a is a schematic diagram of a typical open drain output driver.
Figure 1B:
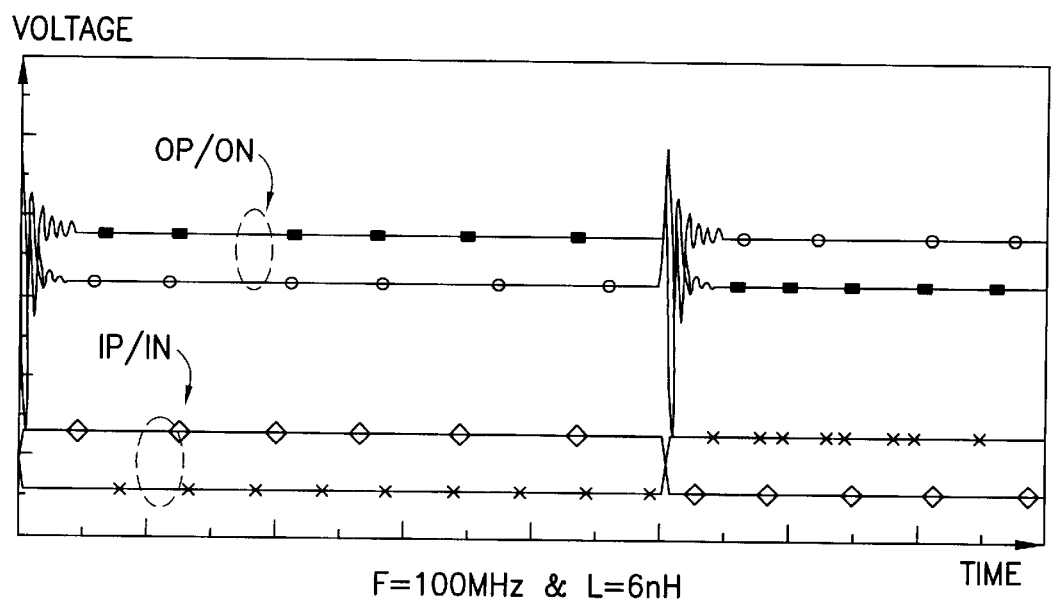
Figure 1C:
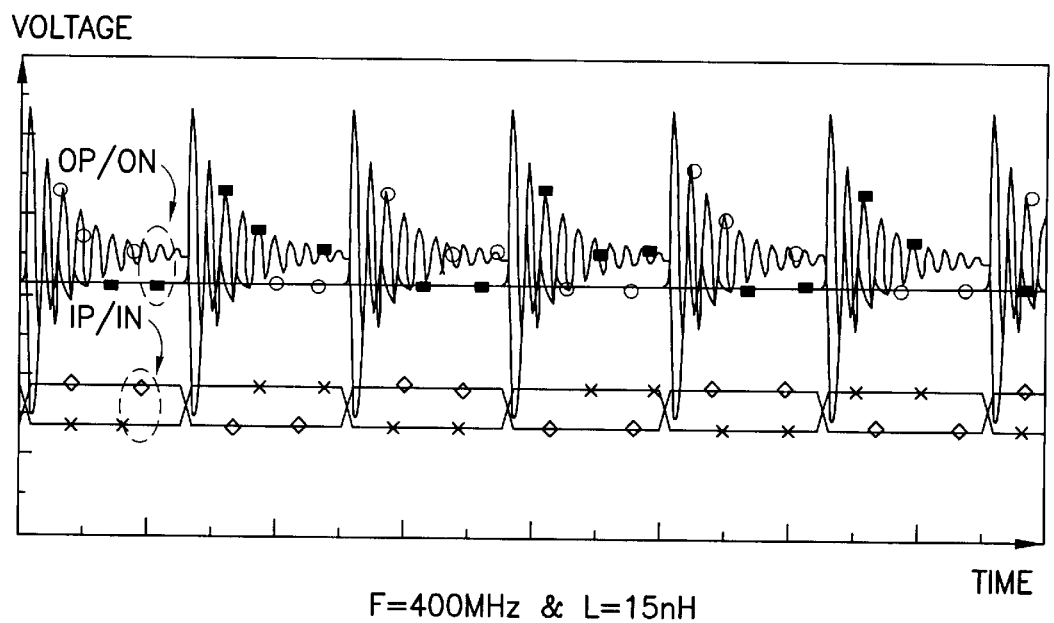
Figure 4:
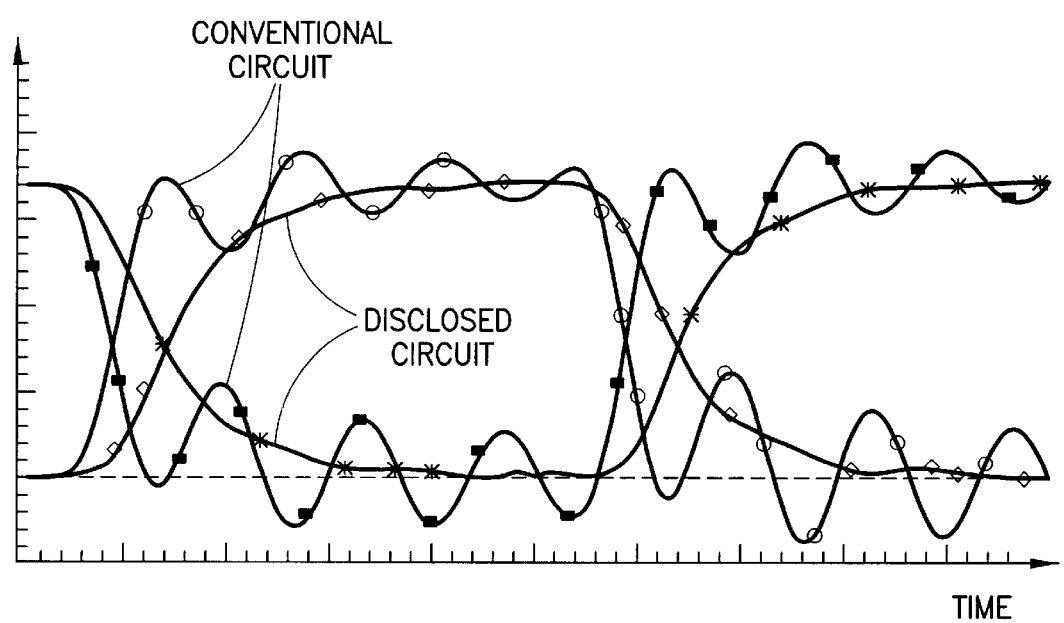
FIG. 4 shows simulated comparative waveforms of a prior art off chip driver and of the circuit of the present invention.

FIG. 4 shows comparative simulated current waveforms between prior art off chip driver and the three stages circuit of the invention when operating at a frequency of 400 MHz and for a load inductance of 15 nH. In this application, the time interval between the input signals has been set to 250 picoseconds while the current in each current source is equal to third the current flowing in the conventional circuit. It is to be appreciated that in this application the settling time of a low to high transition of the output signal measured within 5% of its quiescent value features an improvement of 2× over the prior art off chip driver of FIG. 1, and respectively a 4× improvement for a high to low transition.

Figure 5:
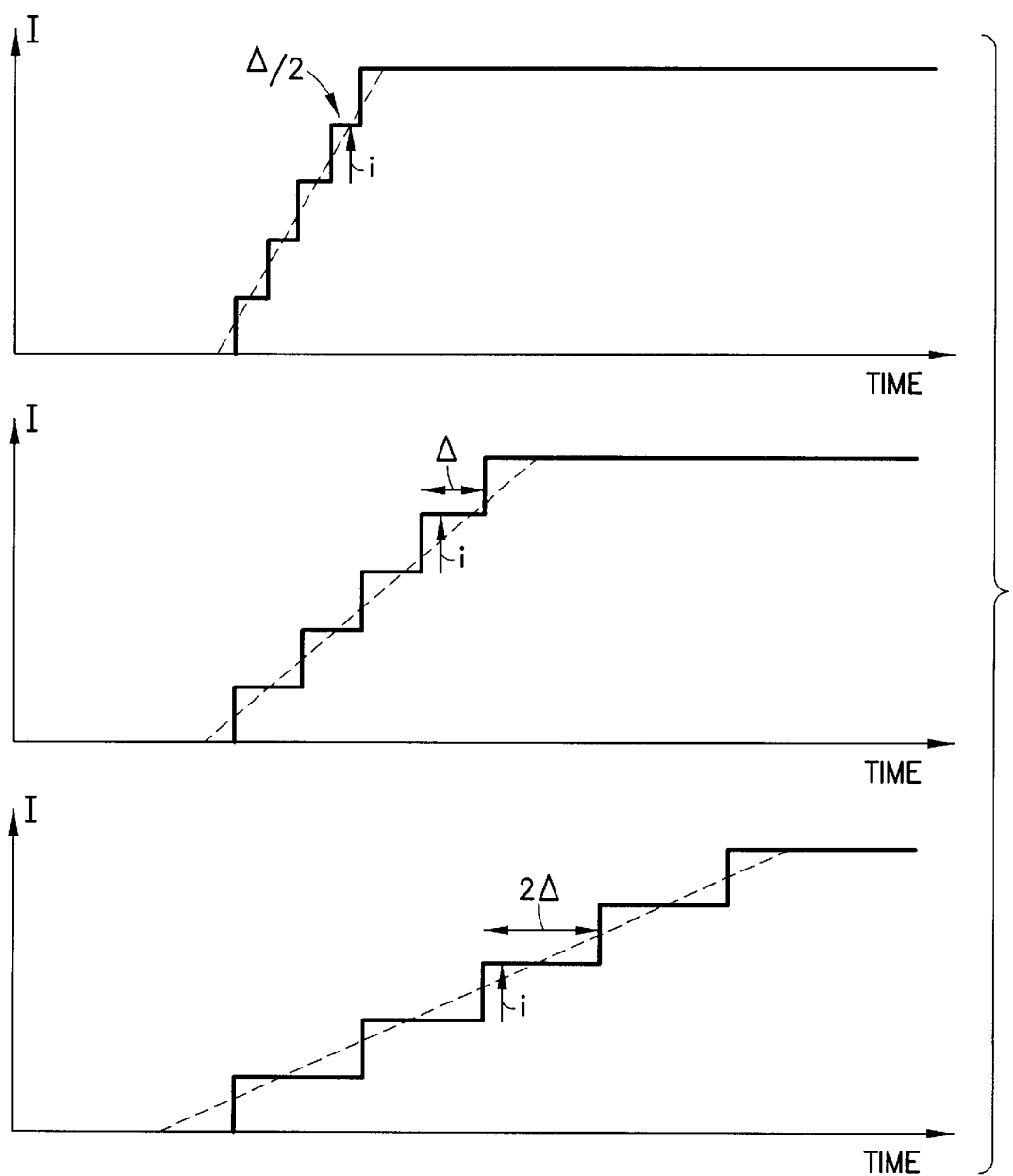
FIG. 5 illustrates theoretical waveforms of output current rising edges of various embodiments of the present invention.

Referring now to FIG. 5, theoretical waveforms of output current rising edges are shown corresponding to various embodiments of the present invention. The circuits to generate these curves operate just as described in FIG. 2 except that five parallel differential pairs are implemented. The three curves respectively illustrate the rising edges of output current flowing in output line 218 or 220 when the delay between the input signals is respectively equal to, Δ, and 2Δ whereas the five current sources are identical. It is to be noted that symmetrical curves are obtained for the falling edges of the output current.

Figure 6:
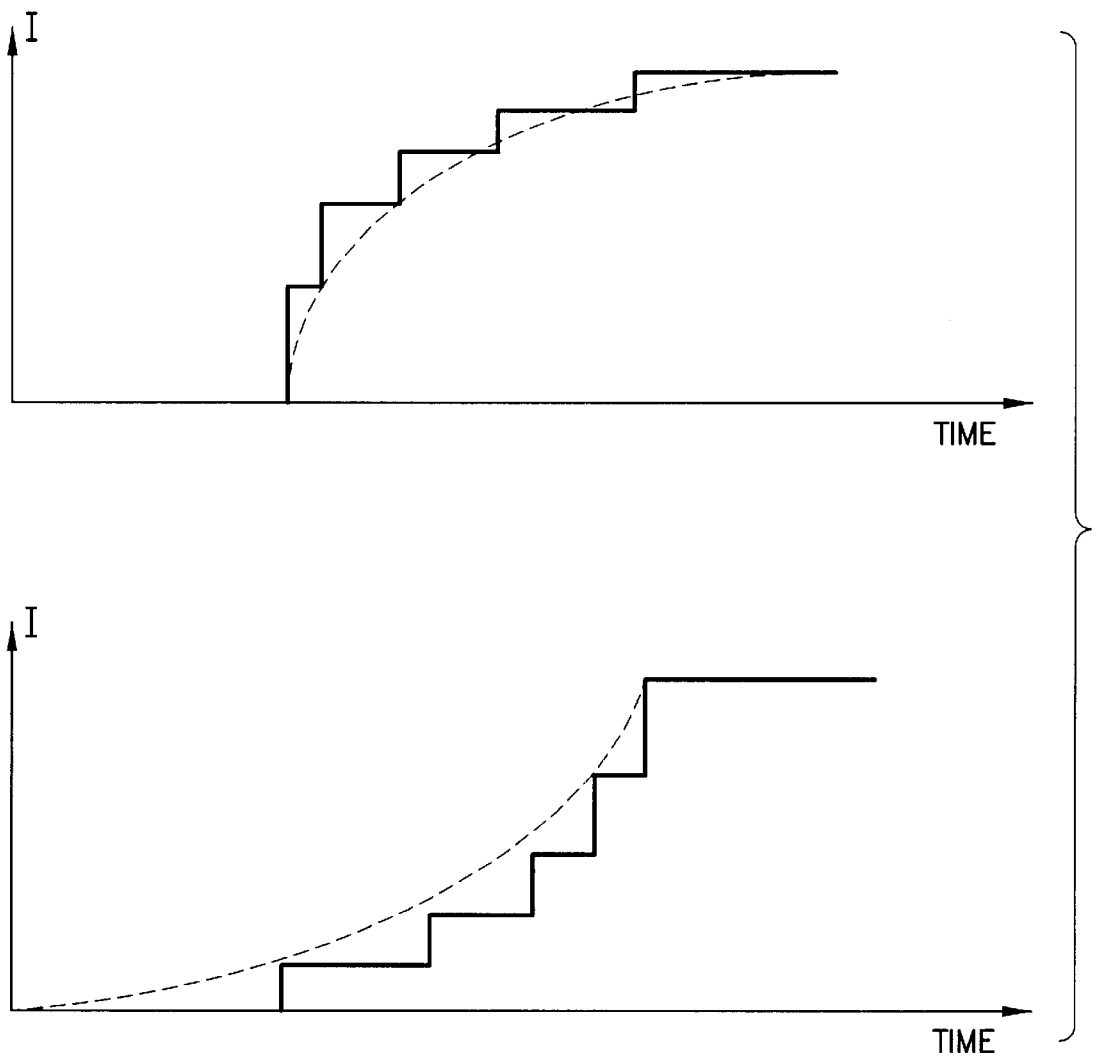
FIG. 6 illustrates theoretical waveforms of output current rising edges of alternate embodiments of the present invention.

With reference to the theoretical waveforms of output current rising edges of FIG. 6 further implementations of the off chip driver of the present invention are contemplated. In this case, the current variations are not linear as in the previous embodiments, but logarithm and exponential waveforms are shown.

Another improvement of the present invention over previous circuits is that the present invention offers an accurate control of the switching delay of the driver whatever is the data pattern applied on the inputs of the differential transistors. The skilled person will readily understand that the time to switch from a high to low transition or from a low to high transition depends on the previous transition. For example the delay to output a data pattern represented by a binary pattern of '101010' is different from the delay to output a data pattern represented by a binary pattern of '111000'. With conventional off chip drivers, the ringing of the output signals alters the delay for different patterns while for the off chip driver of the present invention the ringing phenomena is highly reduced.

The present circuit is particularly well adapted for hard disk drive applications where the control of such delays is essential.

While the invention has been particularly shown and described with reference to a preferred embodiment thereof, it will be understood by those skilled in the art that various modifications and combinations of the illustrative embodiments may be made without departing from the spirit and scope of the invention.

What is claimed is:

1. A slew rate control circuit comprising:

a plurality of differential transistor pairs, each differential transistor pairs receiving sequentially differential pair of input signals and outputting differential pair of outputs signals to a pair of output terminals;

a plurality of current source circuits, each connected to a common terminal of one of said plurality of differential pair of transistors; and a plurality of delay circuits connected in series for generating said plurality of sequentially differential pair of input signals upon receiving a first differential pair of input signals, whereby said pair of output terminals have a pair of output signals that vary in time according to said plurality of delay circuits.

2. The slew rate control circuit according to claim 1, in which the time interval between the sequentially differential pair of input signals is equal.

3. The slew rate control circuit according to claim 2, in which said plurality of current source circuits source currents of equal value.

* * * * *